(12) United States Patent
Kim et al.

(10) Patent No.: US 10,481,640 B2
(45) Date of Patent: Nov. 19, 2019

(54) DISPLAY DEVICE

(71) Applicant: SAMSUNG DISPLAY CO., LTD., Yongin-si, Gyeonggi-do (KR)

(72) Inventors: Tae Woong Kim, Seongnam-si (KR); Hyun Woo Koo, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 58 days.

(21) Appl. No.: 15/613,316

(22) Filed: Jun. 5, 2017

(65) Prior Publication Data

US 2017/0358636 A1 Dec. 14, 2017

(30) Foreign Application Priority Data

Jun. 10, 2016 (KR) .................. 10-2016-0072390

(51) Int. Cl.

| | | |
|---|---|---|
| *G06F 1/16* | (2006.01) | |
| *G09F 9/30* | (2006.01) | |
| *G02F 1/1333* | (2006.01) | |
| *H01L 27/32* | (2006.01) | |
| *H01L 51/00* | (2006.01) | |
| *H01L 51/52* | (2006.01) | |

(52) U.S. Cl.

CPC ...... *G06F 1/1652* (2013.01); *G02F 1/133305* (2013.01); *G09F 9/301* (2013.01); *H01L 27/3246* (2013.01); *H01L 51/0097* (2013.01); *H01L 51/5237* (2013.01); *H01L 51/5253* (2013.01); *Y02E 10/549* (2013.01)

(58) Field of Classification Search
CPC ........................................................ G09F 9/301
See application file for complete search history.

(56) References Cited

U.S. PATENT DOCUMENTS

| | | | |
|---|---|---|---|
| 7,710,370 B2 | 5/2010 | Slikkerveer et al. | |
| 2011/0227822 A1* | 9/2011 | Shai | G06F 1/1615 |
| | | | 345/156 |
| 2016/0320804 A1* | 11/2016 | Takayanagi | G06F 1/1615 |
| 2017/0364119 A1* | 12/2017 | Lee | G06F 1/1652 |
| 2018/0077808 A1* | 3/2018 | Seo | G06F 3/044 |
| 2018/0150107 A1* | 5/2018 | Lee | H04M 1/0216 |

FOREIGN PATENT DOCUMENTS

| | | |
|---|---|---|
| KR | 10-2012-0095019 A | 8/2012 |
| KR | 10-2014-0056444 A | 5/2014 |
| KR | 10-2015-0138450 A | 12/2015 |
| KR | 10-2016-0098677 A | 8/2016 |

* cited by examiner

*Primary Examiner* — Christopher E Mahoney
(74) *Attorney, Agent, or Firm* — Kile Park Reed & Houtteman PLLC

(57) ABSTRACT

A display device including a display panel that displays an image, and a supporting layer positioned on one surface of the display panel. The supporting layer includes a plurality of magnets that are engageable with each other.

15 Claims, 13 Drawing Sheets

DISPLAY DEVICE

CROSS-REFERENCE TO RELATED APPLICATION

Korean Patent Application No. 10-2016-0072390 filed on Jun. 10, 2016, in the Korean Intellectual Property Office, and entitled: "Display Device," is incorporated by reference herein in its entirety.

BACKGROUND

1. Field

Embodiments relate to a display device.

2. Description of the Related Art

Display devices such as an organic light emitting device and a liquid crystal display are manufactured by generating a plurality of layers and elements on a substrate. Glass is used for the substrate of the display device. However, the glass substrate is heavy and easily broken. Further, the glass substrate is rigid so it is difficult to deform the display device. Recently, display devices using a flexible substrate that is light, strong against impacts, and is easily deformed have been developed.

The flexible display device may be classified into a bendable display device, a foldable display device, a rollable display device, and a stretchable display device depending on its use and form.

SUMMARY

Embodiments are directed to a display device including a display panel that displays an image, and a supporting layer positioned on one surface of the display panel. The supporting layer includes a plurality of magnets that are engageable with each other.

The plurality of magnets may include a first magnet including a groove and a second magnet including a protrusion.

The display device may be changeable between a rolled state and an unrolled state, wherein in the unrolled state, the protrusion of the second magnet is inserted into the groove of the first magnet.

The first magnet and the second magnet may be elongated in a direction parallel to a rolling axis of the display device.

The groove of the first magnet and the protrusion of the second magnet may be continuously present along an entire length of the first magnet and the second magnet.

The groove of the first magnet and the protrusion of the second magnet may be discontinuously present throughout an entire length of the first magnet and the second magnet.

The display device may include an elastic gel layer between the display panel and the supporting layer.

The elastic gel layer may include a hybrid gel of a polyacrylamide gel and an alginate gel.

The elastic gel layer may include a modified gel that provides adhesiveness to a surface of the elastic gel layer.

The elastic gel layer may have toughness of about 5,000 to about 9,000 $J/m^2$.

The elastic gel layer may include an upper elastic gel layer and a lower elastic gel layer, each being between the display panel and the supporting layer. A rubber layer is between the display panel and the lower elastic gel layer.

The upper elastic gel layer may be between the display panel and the rubber layer.

The upper elastic gel layer may include a hybrid gel of a polyacrylamide gel and an alginate gel.

A surface of the upper elastic gel layer may include a modified gel that has adhesiveness.

The display device may further include a rubber layer on the display panel.

The display device may further include a window layer on the rubber layer.

The display device may further include an elastic gel layer on the display panel and a window layer on the elastic gel layer.

BRIEF DESCRIPTION OF THE DRAWINGS

Features will become apparent to those of skill in the art by describing in detail exemplary embodiments with reference to the attached drawings in which.

DETAILED DESCRIPTION OF THE EMBODIMENTS

Figure 1:
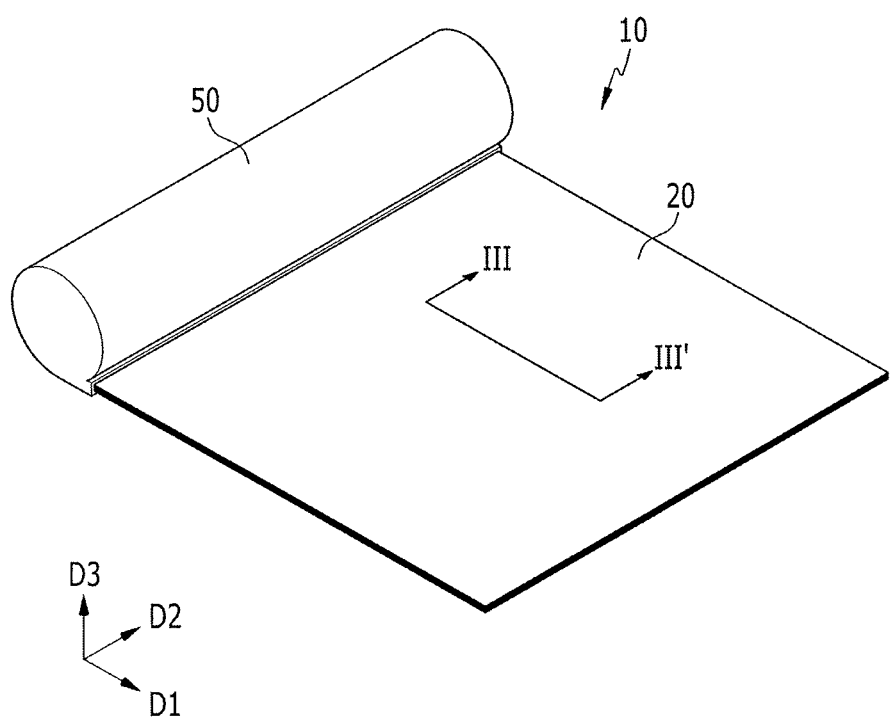
FIG. 1 illustrates a perspective view schematically depicting a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
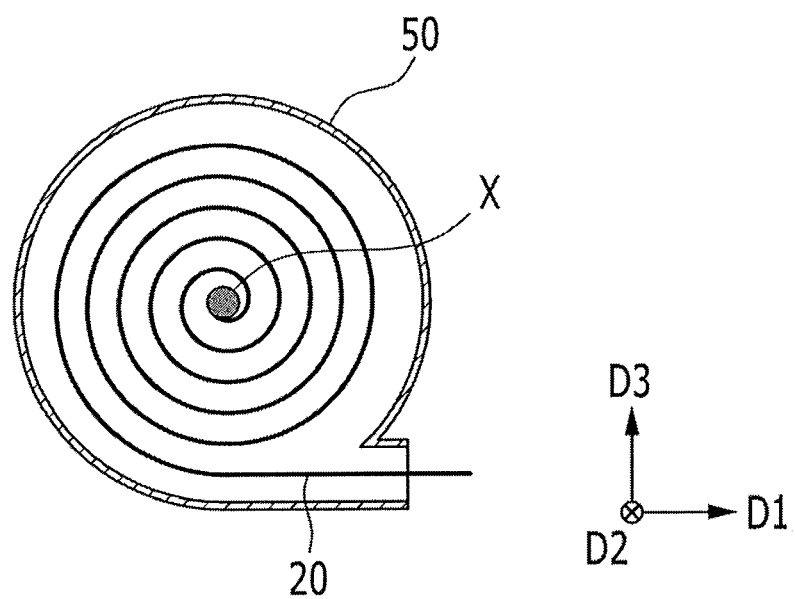
FIG. 2 illustrates a cross-sectional view depicting the display device illustrated in FIG. 1 in a state in which a panel assembly is rolled.

FIG. 1 illustrates a perspective view schematically showing a display device according to an exemplary embodiment, and FIG. 2 illustrates a cross-sectional view showing a state in which a panel assembly is rolled in the display device shown in FIG. 1.

Referring to FIG. 1 and FIG. 2, the display device 10 includes a panel assembly 20 and a housing 50 enclosing the panel assembly 20. The panel assembly 20 may be rolled based on a rolling axis X to be stored in the housing 50, and may be unrolled to be outside of the housing 50. For example, when the rolling axis X is parallel to a second direction D2, the panel assembly 20 may be unrolled in a first direction D1 crossing the second direction D2. One end of the panel assembly 20 may or may not be connected to the rolling axis X. The rolling axis X may be a physical axis or a virtual axis. In some implementations, the display device 10 may not include the housing 50, and the panel assembly 20 may not be stored in the housing 50 when rolled.

The panel assembly 20 may include a display panel including pixels displaying an image. The panel assembly 20 may have a suitable shape. For example, the panel assembly 20 may be quadrangular in the unrolled state. In some implementations, the panel assembly 20 may be oval, circular, or polygonal. In the rolled state, the panel assembly 20 may have a generally circular cross-sectional shape in a direction perpendicular to the rolling axis X.

The panel assembly 20 may have a flexible characteristic allowing the panel assembly 20 to be rolled and unrolled.

The cross-sectional structure of the panel assembly 20 related to the flexible characteristic thereof will be described in detail.

Figure 3:
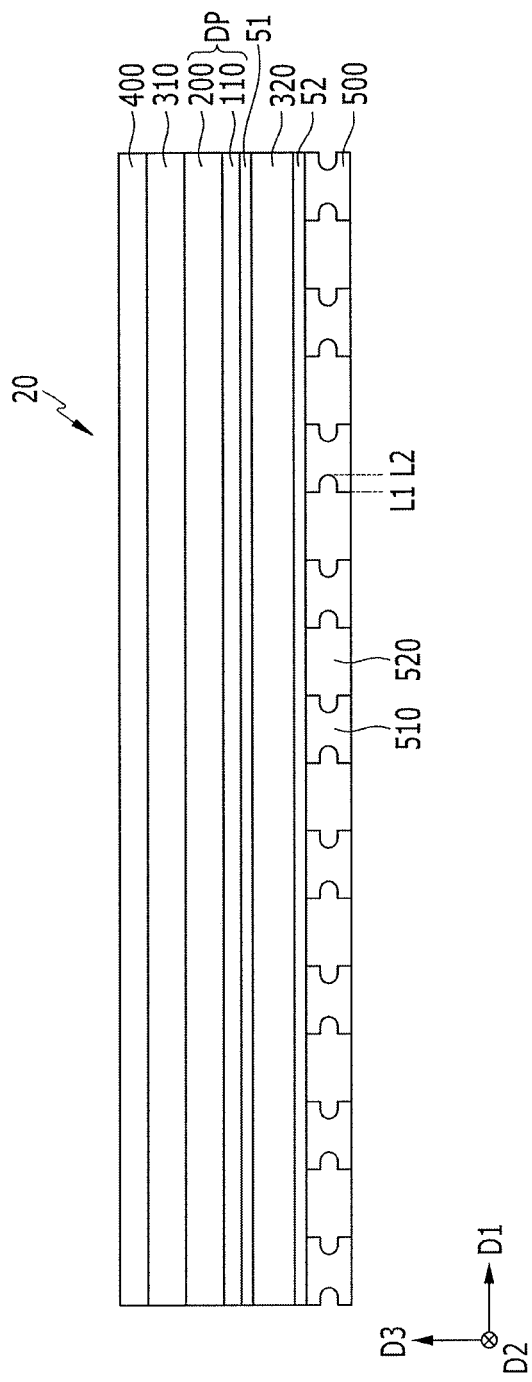
FIG. 3 illustrates a cross-sectional view taken along a line III-III' in FIG. 1 according to an exemplary embodiment.
Figure 4:
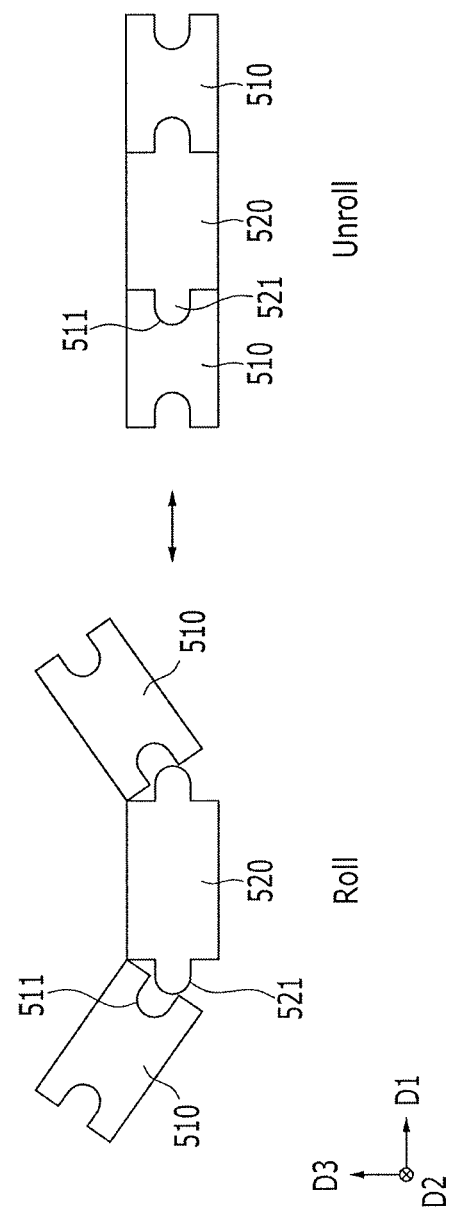
FIG. 4 illustrates a cross-sectional view depicting an engaging structure of the supporting layer shown in FIG. 3.
Figure 5:
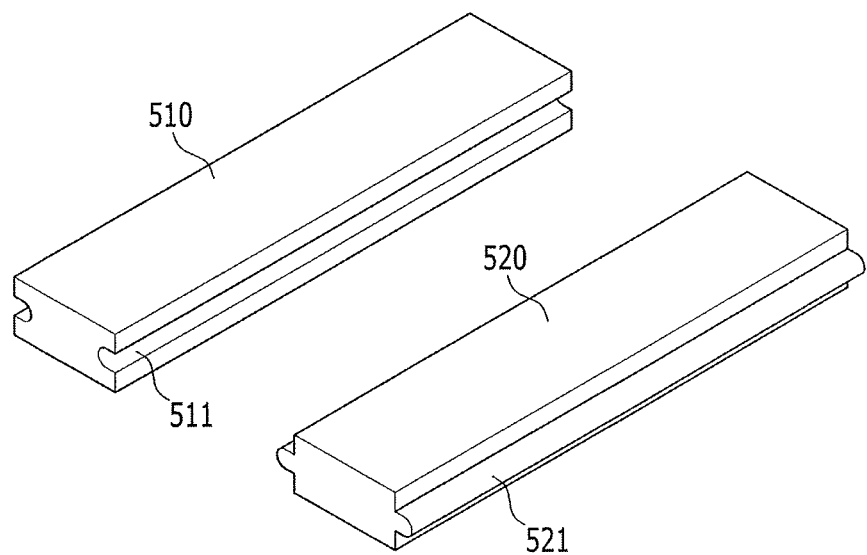
FIG. 5 illustrates a perspective view depicting a first magnet and a second magnet separated from the supporting layer shown in FIG. 3.

FIG. 3 illustrates a cross-sectional view taken along a line in FIG. 1 according to an exemplary embodiment, FIG. 4 illustrates a cross-sectional view showing an engaging structure of the supporting layer shown in FIG. 3, and FIG. 5 illustrates a perspective view showing a first magnet and a second magnet separated from the supporting layer shown in FIG. 3 and separated from each other.

Referring to FIG. 3, the cross-sectional view the panel assembly 20 in a state of being completely unrolled is shown. The panel assembly 20 may include a display panel DP and underlying and overlying layers.

The display panel DP may include a substrate 110 and a display layer 200 formed thereon. The substrate 110 may be a flexible substrate made of a polymer film. The substrate 110 may be formed of, for example, a plastic such as polyimide (PI), polyamide (PA), polyethylene terephthalate (PET), or the like. The display layer 200 may include elements and wires for forming the pixels, and layers insulating or protecting the elements, and the wires. The display layer 200 may include switching elements such as transistors, and a light-emitting device such as an organic light emitting diode. The detailed structure of the display layer 200 is described below.

An upper rubber layer 310 may be positioned on the display panel DP and a lower rubber layer 320 may be positioned under the display panel DP. Herein, in embodiments in which both the upper rubber layer 310 and the lower rubber layer 320 are present, the terms "upper" and "lower" are to be understood to indicate that the upper rubber layer 310 is farther away from the supporting layer 500 (described below) than the lower rubber layer 320 in the unrolled state of the display panel DP. The upper rubber layer 310 may be formed of a coating-type rubber. For example, the upper rubber layer 310 may be formed by coating and curing a rubber material onto the display panel DP. The upper rubber layer 310 may be attached to the display panel DP while being cured, thereby being adhered to the display panel DP without a separate adhesive. The lower rubber layer 320 may be formed by laminating a prepared rubber film onto the display panel DP using an adhesive. In some implementations, the lower rubber layer 320 may be formed of a coating-type rubber material like the upper rubber layer 310. The rubber material for the upper and lower rubber layers 310 and 320 may be formed of a rubber material that is highly stretchable. The rubber material may include, for example, a urethane-based rubber such as polyurethane (PU), a silicon-based rubber such as polydimethylsiloxane (PDMS), and/or an acryl-based rubber.

As a number of rolls and unrolls of the panel assembly 20 including the display panel DP increases, the restoring force of the display panel DP is deteriorated such that the panel assembly 20 may not be completely unrolled, or even if the panel assembly 20 is unrolled, the panel assembly 20 may not be flat. According to an exemplary embodiment, when the upper and lower rubber layers 310, 210, are made of a rubber that has an excellent restoring force and are provided on both surfaces of the display panel DP, the restoring force of the display panel DP may be improved. The upper and lower rubber layers 310 and 320 may serve as a protecting layer to absorb impacts applied to the display panel DP and to prevent the display panel DP from being damaged. The upper rubber layer 310 or the upper and lower rubber layers 310 and 320 may be optically transparent so as to not block the image displayed on the display panel DP. In some implementations, one or both of the upper and lower rubber layers 310 and 320 may be omitted.

A supporting layer 500 may be positioned under the lower rubber layer 320 below the display panel DP. The supporting layer 500 may include first and second magnets 510 and 520 that are detachable from each other and engageable to each other. The first magnets 510 and the second magnets 520 may be alternately positioned side by side in the first direction D1. The first and second magnets 510 and 520 may be elongated in a second direction D2 parallel to the rolling axis X, thereby having a bar shape. When the panel assembly 20 is rolled, the first magnets 510 and the second magnets 520 may be moved to be at least partially detached from each other. When the panel assembly 20 is completely unrolled, the sides of the first magnets 510 and the second magnets 520 may be in complete contact with each other. When the sides of the first magnets 510 and the second magnets 520 are in complete contact with each other, the supporting layer 500 may be in a flat state. The flat state may be enhanced by a magnetic force acting between the first magnets 510 and the second magnets 520.

A structure in which the first and second magnets 510 and 520 of the supporting layer 500 are engaged with each other will be described with reference to FIG. 4. FIG. 4 illustrates two first magnets 510 and a second magnet 520 therebetween in the panel assembly 20. A left view and a right view of FIG. 4 respectively illustrate a state in which the panel assembly 20 is rolled and a state in which the panel assembly 20 is unrolled.

In some implementations, the first magnet 510 may have a groove 511, and the second magnet 520 may have a protrusion 521 corresponding to the groove 511 of the first magnet 510. The shape of the groove 511 and the shape of the protrusion 521 may be complementary. When the panel assembly 20 is rolled, the protrusion 521 of the second magnet 520 may come out of the groove 511 of the first magnet 510. The protrusion 521 may partially come out of the groove 511 or may completely come out of the groove 511 depending on the degree of rolling. When the panel assembly 20 is unrolled, the protrusion 521 of the second magnet 520 may be inserted into the groove 511 of the first magnet 510 to bring the first magnet 5110 and the second magnet 520. Accordingly, as shown in FIG. 3, the sides of the first magnet 510 and the second magnet 520, may substantially meet in a first line L1. The protrusion 521 of the second magnet 520 may be inserted up to a second line L2 corresponding to a depth to which the groove 511 of the first magnet 510 is formed.

As described above, when the grooves 511 of the first magnets 510 and the protrusions 521 of the second magnets 520 are provided, a contact area between the first magnets 510 and the second magnets 520 may increase. Accordingly, a close contacting property and a bonding strength between the first magnets 510 and the second magnets 520 may increase such that a force to maintain the flatness of the supporting layer 500 may be further increased. The flatness of the display panel DP supported by the supporting layer 500 may also be improved. The supporting layer 500 may a structure in which the protrusion 521 of the second magnet 520 may easily exit from the groove 511 of the first magnet 510 when the panel assembly 20 is rolled.

Referring to FIG. 5, the groove 511 of the first magnet 510 and the protrusion 521 of the second magnet 520 may be continuously formed along the entire length of the first magnet 510 and the second magnet 520 at both sides of the first magnet 510 and the second magnet 520. In some implementations, the groove 511 and the protrusion 521 may be formed discontinuously.

Again referring to FIG. 3, an upper elastic gel layer 51 may be positioned between the display panel DP and the lower rubber layer 320. A lower elastic gel layer 52 may be positioned between the lower rubber layer 320 and the supporting layer 500. Herein, in embodiments in which both the upper elastic gel layer 51 and the lower elastic gel layer 52, are present, the terms "upper" and "lower" are to be understood to indicate that the upper elastic gel layer 51 is farther away from the supporting layer 500 than the upper elastic gel layer 52 in the unrolled state of the display panel DP. Each of the upper and lower elastic gel layers 51 and 52 may have toughness of, for example, about 9,000 J/m² or less, or, for example, a toughness of about 5,000 to about 9,000 J/m². The upper and lower elastic gel layers 51 and 52 may have a very high toughness or fracture energy compared to a layer formed of a general gel. In this regard, the upper and lower elastic gel layers 51 and 52 may be a formed of a tough gel material that is highly stretchable and restorable. The tough gel material may include a hydrogel and/or an organogel. The tough gel material may be, for example, a hybrid gel including polyacrylamide gel and an alginate gel.

The upper and lower elastic gel layers 51 and 52 may have adhesiveness provided, for example, through a surface treatment. The supporting layer 500 or the rubber layer 320 may be adhered by the upper and lower elastic gel layers 51 and 52. In some implementations, an adhesive such as a pressure sensitive adhesive (PSA) and an optically clear adhesive (OCA) may be used. However, because the adhesive such as PSA and OCA has a weak restoring force, when a panel assembly including a PSA or OCA is unrolled, the adhesive could undesirably affect the planarization of the panel assembly 20. According to an exemplary embodiment the upper and lower elastic gel layers 51 and 52 with adhesiveness provided through a surface treatment have a high restoring force. Accordingly, even if the rolling and the unrolling of the panel assembly 20 is repeated over a long period, the flatness of the panel assembly 20 and the display panel DP may be maintained. The upper and lower elastic gel layers 51 and 52 may provide a restoration characteristic for the high flatness of the display panel DP and the panel assembly 20.

An optically transparent window layer 400 may be positioned on the upper rubber layer 310 over the display panel DP. The window layer 400 may provide a desirable surface characteristic of the panel assembly 20 while protecting the underlying layers and the display panel DP. After forming a non-cured upper rubber layer 310 by coating an uncured rubber material between the display panel DP and the window layer 400, the window layer 400 may be adhered to the rubber layer 310 by curing the upper rubber layer 310. In some implementations, the window layer 400 may be adhered to the rubber layer 310 through a separate adhesive such as a PSA. A touch screen panel may be positioned between the upper rubber layer 310 and the window layer 400. The touch screen panel may be formed at one surface of the window layer 400, for example, the surface that is in contact with the upper rubber layer 310.

Until now, the panel assembly 20 according to an exemplary embodiment has been described with reference to FIG. 3 to FIG. 5. Next, the panel assembly 20 according to another exemplary embodiment will be described with reference to FIG. 6 to FIG. 8.

Figure 6:
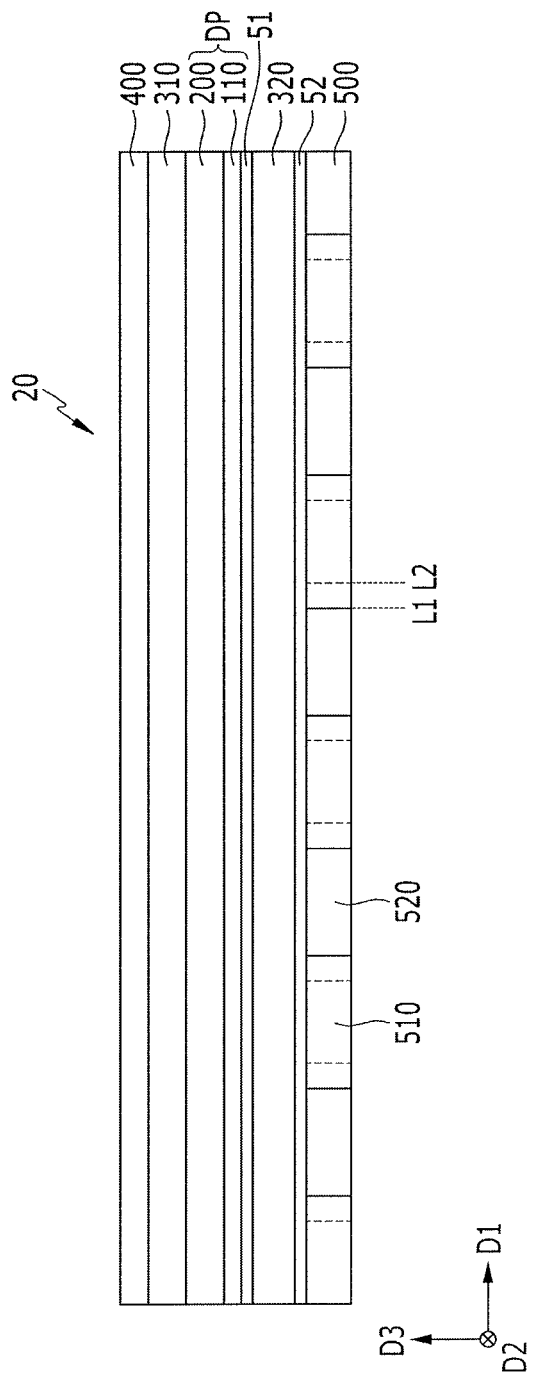
FIG. 6 illustrates a cross-sectional view taken along a line III-III' in FIG. 1 according to an exemplary embodiment.
Figure 7:
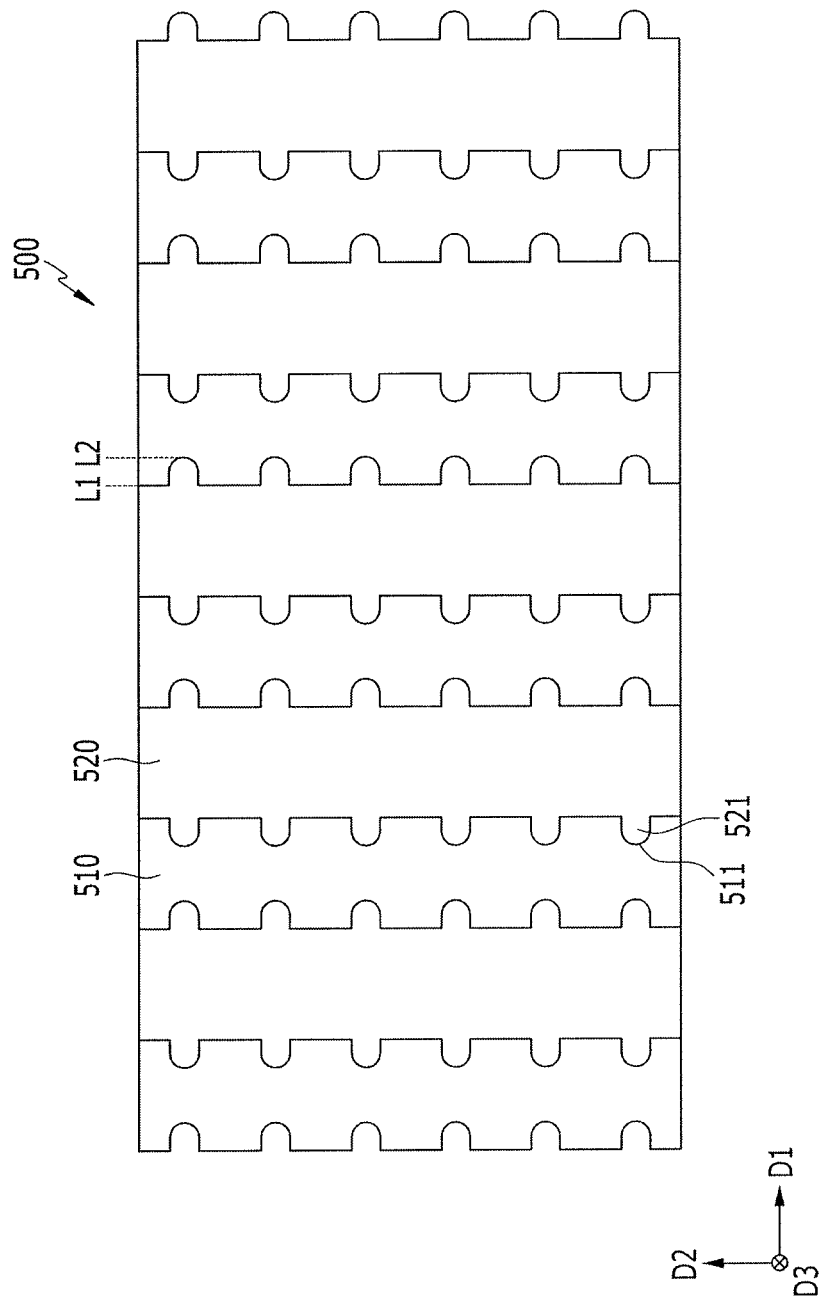
FIG. 7 illustrates a top plan view showing an engaged state of the supporting layer shown in FIG. 6.
Figure 8:
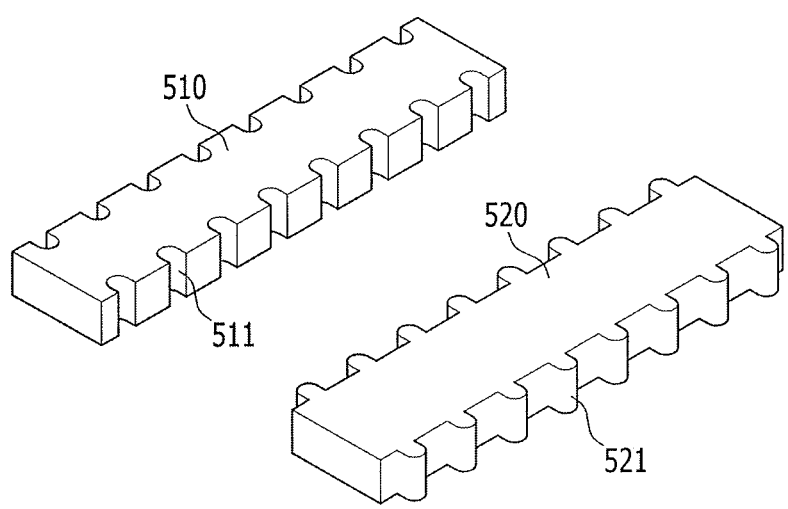
FIG. 8 illustrates a perspective view showing a first magnet and a second magnet from a supporting layer shown in FIG. 6 separated from each other.

FIG. 6 illustrates a cross-sectional view taken along a line in FIG. 1 according to an exemplary embodiment, FIG. 7 illustrates a top plan view showing an engaged state of a supporting layer shown in FIG. 6, and FIG. 8 illustrates a perspective view showing a first magnet and a second magnet separated from a supporting layer shown in FIG. 6.

The remaining constituent elements of the panel assembly 20 of this exemplary embodiment may be the same as in the above-described exemplary embodiment except for a difference in the structure of the supporting layer 500. Accordingly, only the supporting layer 500 described.

Referring to FIG. 6 and FIG. 7, below the display panel DP, the supporting layer 500 may be positioned under the second rubber layer 320. The supporting layer 500 may be adhered to the second rubber layer 320 through the lower elastic gel layer 52. The supporting layer 500 may include the first and second magnets 510 and 520 that are detachable from each other and engageable with each other. The first magnets 510 and the second magnets 520 may be alternately positioned side by side in the first direction D1. The first and second magnets 510 and 520 may be formed to be elongated in the second direction D2 parallel to the rolling axis X, thereby having a bar shape.

In the state in which the panel assembly 20 is completely unrolled, the sides of adjacent ones of the first magnet 510 and the second magnet 520 may be in contact with each other. The grooves 511 may be formed in the first magnet 510, and the protrusions 521 corresponding to the grooves 511 of the first magnet 510 may be formed in the second magnet 520. The shape of the grooves 511 and the shape of the protrusions 521 may be complementary. Referring to FIG. 7 and FIG. 8, the grooves 511 of the first magnet 510 and the protrusions 521 of the second magnet 520 may be formed with a predetermined interval throughout the entire length of the first magnet 510 and the second magnet 520 with the bar shape.

If the panel assembly 20 is unrolled, the state in which the protrusions 521 of the second magnet 520 are inserted to the grooves 511 of the first magnet 510 may be formed. Accordingly, the sides of the first magnet 510 and the second magnet 520 may substantially meet on the first line L1, and the protrusions 521 of the second magnet 520 may be inserted up to the second line L2 corresponding to the depth of the grooves 511 formed in the first magnet 510. When the panel assembly 20 is rolled, the contacting sides of the first magnet 510 and the second magnet 520 may be moved to be separated. In this case, the protrusions 521 of the second magnet 520 may at least partially exit in the approximate row direction of the first magnet 510 from the grooves 511 of the first magnet 510. Accordingly, the grooves 511 of the first magnet 510 and the protrusions 521 of the second magnet 520 may not interfere with the rolling of the panel assembly 20.

As above-described, when the first magnets 510 and the second magnets 520 are provided, the contact area between the first magnets 510 and the second magnets 520 may increase, and the close contacting property and the bonding strength between the first magnets 510 and the second magnets 520 may increase. Accordingly, the force to maintain the flatness of the supporting layer 500 may further increase. Accordingly, the flatness of the display panel DP supported by the supporting layer 500 may be maintained.

Next, the panel assembly 20 according to another exemplary embodiment will be described with reference to FIG. 9 to FIG. 12.

FIG. 9, FIG. 10, FIG. 11, and FIG. 12 illustrate cross-sectional views taken along a line III-III' in FIG. 1 according to an exemplary embodiment.

Figure 9:
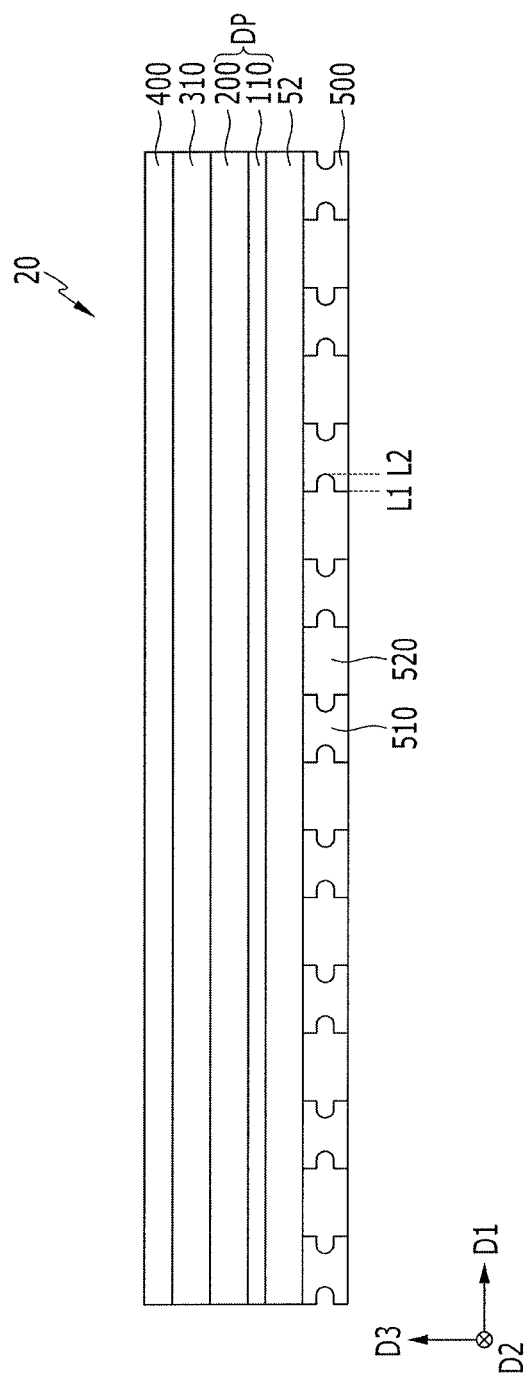
FIG. 9, FIG. 10, FIG. 11, and FIG. 12 illustrate cross-sectional views taken along a line in FIG. 1 according to exemplary embodiments.

Referring to FIG. 9, the panel assembly 20 may be substantially similar to the panel assembly 20 of the exemplary embodiment of FIG. 3, except for not including the upper rubber layer 320 under the display panel DP. Accordingly, the supporting layer 500 may be adhered to the display panel DP through the lower elastic gel layer 52. In order to compensate for the restoring force provided by the lower rubber layer 320, the lower elastic gel layer 52 may be more thickly formed than the lower elastic gel layer 52 shown in FIG. 3.

Figure 10:
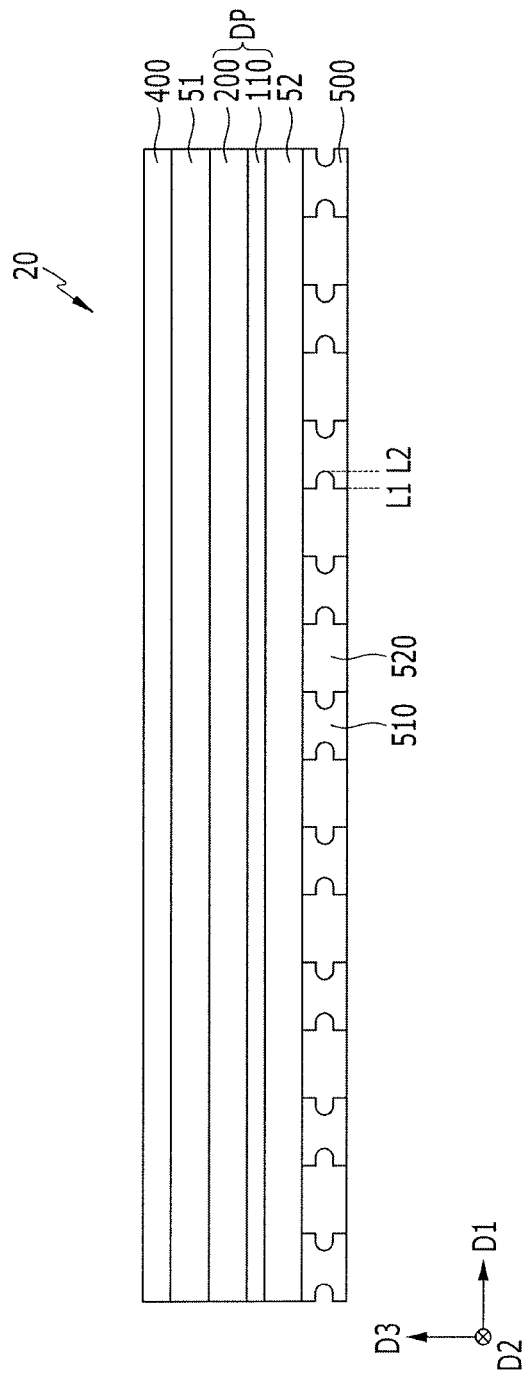

Referring to FIG. 10, the panel assembly 20 may be substantially similar to the panel assembly 20 of the exemplary embodiment of the FIG. 9, except that the upper elastic gel layer 51, instead of the upper rubber layer 310, is positioned between the display panel DP and the window layer 400. The surface of the upper elastic gel layer 51 may be modified to have adhesiveness. An additional adhesive to adhere the display panel DP or the window layer 400 may be omitted. The upper elastic gel layer 51 may improve the restoring force (i.e., the force to return to the unrolled state) of the panel assembly 20 along with the lower elastic gel layer 52 positioned under the display panel DP, thereby increasing the flatness of the display panel DP.

Figure 11:
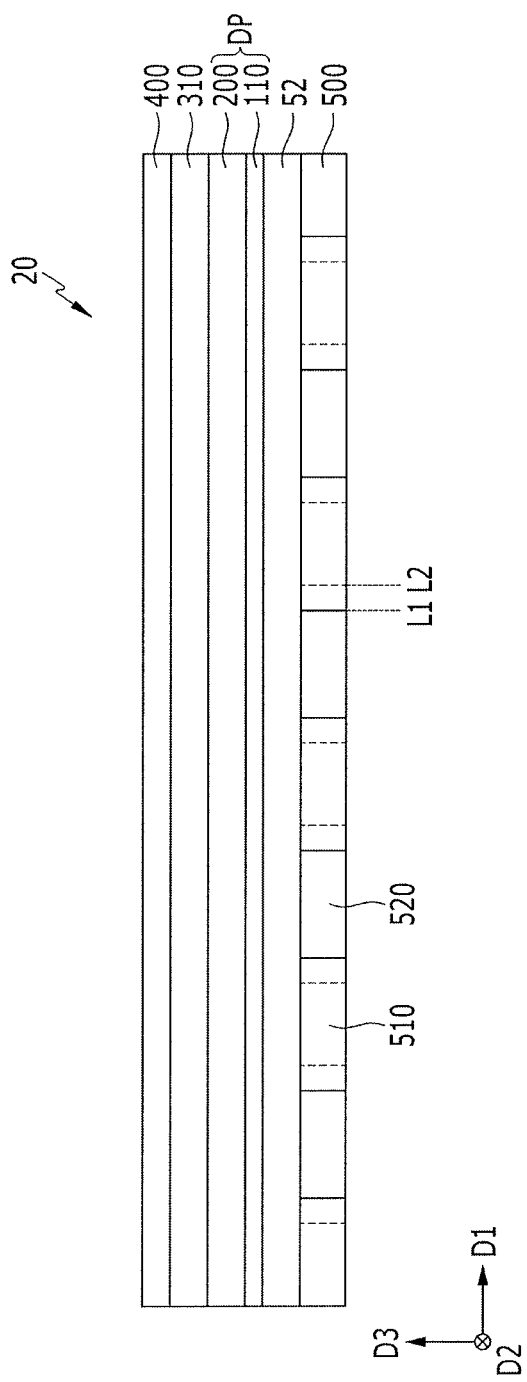

Referring to FIG. 11, the panel assembly 20 may be substantially similar to the panel assembly 20 of the exemplary embodiment of FIG. 6, except for not including the lower rubber layer 320 under the display panel DP. For example, the supporting layer 500 may be adhered to the display panel DP through the lower elastic gel layer 52. The lower elastic gel layer 52 may be formed to be thicker than the lower elastic gel layer 52 shown in FIG. 6.

Figure 12:
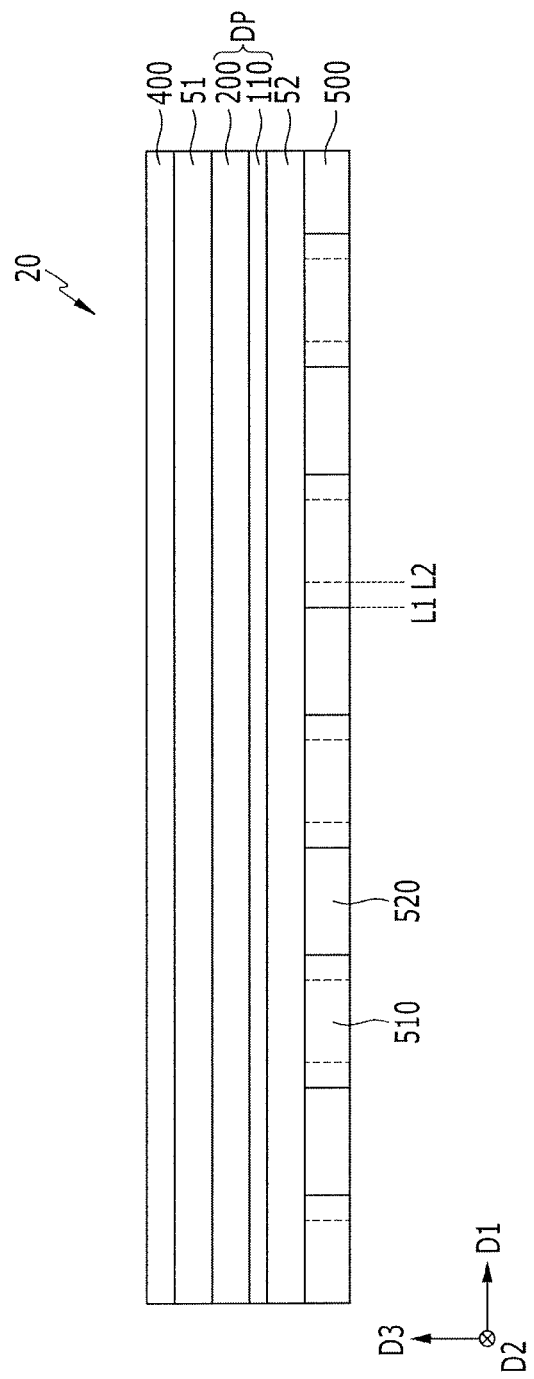

Referring to FIG. 12, the panel assembly 20 is substantially similar to the panel assembly 20 of the exemplary embodiment of FIG. 11, except that the upper elastic gel layer 51 instead of the upper rubber layer 310 may be positioned between the display panel DP and the window layer 400. The surface of the upper elastic gel layer 51 may be modified to have adhesiveness. Accordingly, the display panel DP or the window layer 400 may be adhered through the upper elastic gel layer 51 without the use of the additional adhesive. The upper elastic gel layer 51, along with the lower elastic gel layer 52 positioned under the display panel DP, may contribute improving the restoring force of the panel assembly 20 and the flatness of the display panel DP.

Next, an organic light emitting panel as an example of the display panel DP will be described in detail with reference to FIG. 13.

Figure 13:
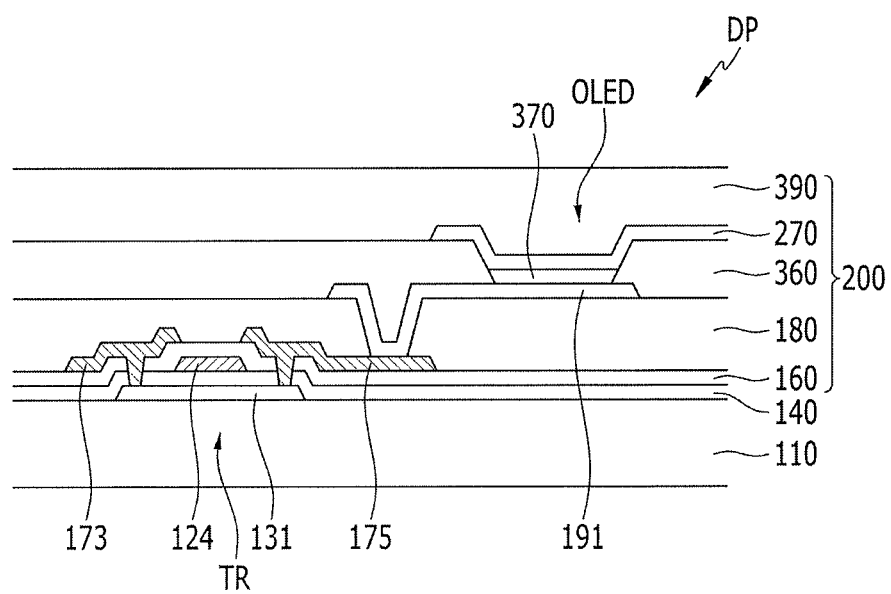
FIG. 13 illustrates a cross-sectional view showing a stacked structure of a display panel according to an exemplary embodiment.

FIG. 13 is a cross-sectional view showing a stacked structure of a display panel according to an exemplary embodiment.

The display panel DP may include a flexible substrate 110 and a display layer 200 formed on the flexible substrate 110. A plurality of pixels may be formed in the display layer 200. Each pixel may include transistors and an organic light emitting diode. The stacked structure of a portion of the display panel DP corresponding to a pixel having one transistor TR and one organic light emitting diode (OLED) connected thereto will be described.

A buffer layer and a barrier layer for preventing the diffusion of impurities and the penetration of moisture, which can cause degradation of semiconductor characteristics, may be disposed inside the substrate 110 and/or on the substrate 110.

A semiconductor 131 of a transistor TR may be disposed on the substrate 110, and a gate insulating layer 140 may be disposed on the semiconductor 131. The semiconductor 131 may include a source region and a drain region, and a channel region, which is disposed between the source region and the drain region. The semiconductor 131 may include a polysilicon, an oxide semiconductor, or amorphous silicon. The gate insulating layer 140 may include an inorganic insulating material such as a silicon oxide, a silicon nitride, and the like.

A gate conductor including a gate electrode 124 of the transistor TR may be positioned on the gate insulating layer 140. The gate conductor, for example, may include a metal such as copper (Cu), aluminum (Al), silver (Ag), molybdenum (Mo), chromium (Cr), tantalum (Ta), titanium (Ti), etc., or metal alloys thereof.

An interlayer insulating layer 160 may be positioned on the gate conductor. The interlayer insulating layer 160 may include an inorganic material.

A data conductor including a source electrode 173 and a drain electrode 175 of the transistor TR may be positioned on the interlayer insulating layer 160. The source electrode 173 and the drain electrode 175 may be respectively connected to the source region and the drain electrode of the semiconductor 131 through contact holes formed in the interlayer insulating layer 160 and the gate insulating layer 140. The data conductor may include, for example, metals such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), etc., or metal alloys thereof.

A passivation layer 180 may be disposed on the data conductor. The passivation layer 180 may include an organic material. A pixel electrode 191 may be positioned on the passivation layer 180. The pixel electrode 191 may be connected to the drain electrode 175 through a contact hole formed in the passivation layer 180, thereby receiving a data signal controlling luminance of the organic light emitting diode (OLED).

A pixel defining layer 360 may be disposed on portions of the passivation layer 180 and the pixel electrode 191. The pixel defining layer 360 may include an opening overlapped with the pixel electrode 191. In the opening of the pixel defining layer 360, an emission layer 370 may be disposed on the pixel electrode 191, and a common electrode 270 may be disposed on the emission layer 370. The pixel electrode 191, the emission layer 370, and the common electrode 270 together may form the organic light emitting diode (OLED). The pixel electrode 191 may be an anode of the organic light emitting diode (OLED), and the common electrode 270 may be a cathode of the organic light emitting diode (OLED). The common electrode 270 may include a transparent conductive material such as an indium tin oxide (ITO) and an indium zinc oxide (IZO).

An encapsulation layer 390 for protecting the organic light emitting diode (OLED) may be disposed on the common electrode 270. The encapsulation 390 may include at least one organic material layer and/or at least one inorganic material layer.

In some implementations, the display panel DP may include another type of display device, such as a liquid crystal panel including a liquid crystal layer, for example.

By way of summation and review, a rollable display device may allow a display panel to roll or unroll like a roll of paper while displaying an image. In the rollable display device, it may be desirable for the display panel to be spread as flat as possible. However, when an operation in which the display panel is rolled and unrolled is repeated, resilience or flatness of the display panel in the flattened state may deteriorate.

Embodiments provide a display devise in which a restoring force and flatness of the display panel of the display device are improved Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
a display panel that displays an image; and
a supporting layer positioned on one surface of the display panel,
wherein:
the supporting layer includes a plurality of magnets that are engageable with each other,
the plurality of magnets include a first magnet including a groove and a second magnet including a protrusion,
the display device is changeable between a rolled state and an unrolled state, wherein in the unrolled state, the protrusion of the second magnet is inserted into the groove of the first magnet,
and the supporting layer is disposed continuously along a direction parallel to a rolling axis of the display device.

2. The display device as claimed in claim 1, wherein:
the first magnet and the second magnet are elongated in the direction parallel to a rolling axis of the display device.

3. The display device as claimed in claim 2, wherein:
the groove of the first magnet and the protrusion of the second magnet are continuously present along an entire length of the first magnet and the second magnet.

4. The display device as claimed in claim 2, wherein:
the groove of the first magnet and the protrusion of the second magnet are discontinuously present throughout an entire length of the first magnet and the second magnet.

5. The display device as claimed in claim 1, further comprising
an elastic gel layer between the display panel and the supporting layer.

6. The display device as claimed in claim 5, wherein
the elastic gel layer includes a hybrid gel of a polyacrylamide gel and an alginate gel.

7. The display device as claimed in claim 5, wherein:
the elastic gel layer includes a modified gel that provides adhesiveness to a surface of the elastic gel layer.

8. The display device as claimed in claim 5, wherein:
the elastic gel layer has toughness of about 5,000 to about 9,000 $J/m^2$.

9. The display device as claimed in claim 5, wherein:
the elastic gel layer includes an upper elastic gel layer and a lower elastic gel layer, each being between the display panel and the supporting layer, and
a rubber layer is between the display panel and the lower elastic gel layer.

10. The display device as claimed in claim 9, wherein:
the upper elastic gel layer is between the display panel and the rubber layer.

11. The display device as claimed in claim 10, wherein:
the upper elastic gel layer includes a hybrid gel of a polyacrylamide gel and an alginate gel.

12. The display device as claimed in claim 10, wherein:
a surface of the upper elastic gel layer includes a modified gel that has adhesiveness.

13. The display device as claimed in claim 1, further comprising:
a rubber layer on the display panel.

14. The display device as claimed in claim 13, further comprising:
a window layer on the rubber layer.

15. The display device as claimed in claim 1, further comprising:
an elastic gel layer on the display panel; and
a window layer on the elastic gel layer.

* * * * *